United States Patent
Binet et al.

(10) Patent No.: US 12,140,483 B2
(45) Date of Patent: Nov. 12, 2024

(54) ENHANCED TEMPERATURE SENSOR

(71) Applicant: STMicroelectronics (Rousset) SAS, Rousset (FR)

(72) Inventors: Vincent Binet, Aix en Provence (FR); Bruno Gailhard, Peypin (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 623 days.

(21) Appl. No.: 17/452,224

(22) Filed: Oct. 25, 2021

(65) Prior Publication Data
US 2022/0163408 A1  May 26, 2022

(30) Foreign Application Priority Data
Nov. 24, 2020 (FR) ........................ 2012056

(51) Int. Cl.
| | |
|---|---|
| *G01K 15/00* | (2006.01) |
| *G01K 7/00* | (2006.01) |
| *G01K 7/20* | (2006.01) |
| *G01K 7/01* | (2006.01) |

(52) U.S. Cl.
CPC ........... *G01K 15/005* (2013.01); *G01K 7/203* (2013.01); *G01K 7/015* (2013.01)

(58) Field of Classification Search
CPC ........ G01K 15/005; G01K 7/203; G01K 7/32; G01K 5/72; H03K 3/0315; H03K 3/00
See application file for complete search history.

(56) References Cited

U.S. PATENT DOCUMENTS

| | | | | |
|---|---|---|---|---|
| 4,549,618 A | * | 10/1985 | Kono | ..................... G01G 13/29 177/1 |
| H1744 H | * | 8/1998 | Clayton | ........................ 374/170 |
| 6,628,558 B2 | * | 9/2003 | Fiscus | ..................... G11C 5/147 327/512 |

(Continued)

FOREIGN PATENT DOCUMENTS

| | | | | |
|---|---|---|---|---|
| CN | 108921995 A | * | 11/2018 | |
| GB | 2475123 A | * | 5/2011 | ............... G01K 7/32 |

(Continued)

OTHER PUBLICATIONS

17452224_2024-08-06_CN_108921995_A_H.pdf,Nov. 30, 2018.*

(Continued)

*Primary Examiner* — Gail Kaplan Verbitsky
(74) *Attorney, Agent, or Firm* — Slater Matsil, LLP

(57) ABSTRACT

A calibration method of a temperature sensor is provided. The temperature sensor having a current source and a ring oscillator generating a square pulse signal with a temperature-dependent square pulse frequency. The acquisition of a first square pulse frequency measurement at a first temperature from the square pulse signal forms a first measurement point. A second square pulse frequency measurement at a second temperature from the second square pulse signal forms a second measurement point. The determination of the relation data being representative of an affine relation between square pulse frequency measurements and temperatures. The affine relation being defined by a used proportionality coefficient modified with respect to a measured proportionality coefficient of a measured affine relation linking the first measurement point and the second measurement point.

20 Claims, 8 Drawing Sheets

(56) References Cited

U.S. PATENT DOCUMENTS

| | | | | |
|---|---|---|---|---|
| 9,024,727 | B1* | 5/2015 | Otis | G01K 5/72 |
| | | | | 340/505 |
| 10,473,530 | B2* | 11/2019 | Fan | H03K 3/0315 |
| 2001/0028278 | A1* | 10/2001 | Ooishi | G05F 3/262 |
| | | | | 327/512 |
| 2003/0156622 | A1* | 8/2003 | Gold | G01K 7/01 |
| | | | | 374/170 |
| 2005/0225415 | A1* | 10/2005 | Mahony | H03K 3/0315 |
| | | | | 374/100 |
| 2012/0140792 | A1* | 6/2012 | Yeh | G01K 7/01 |
| | | | | 374/170 |
| 2015/0355033 | A1* | 12/2015 | Zhang | G01K 7/015 |
| | | | | 374/170 |
| 2015/0355037 | A1 | 12/2015 | Cottin | |
| 2019/0257696 | A1* | 8/2019 | Rachala | G01K 15/005 |
| 2024/0162892 | A1* | 5/2024 | Kano | H03K 3/011 |

FOREIGN PATENT DOCUMENTS

| | | | | |
|---|---|---|---|---|
| JP | 57207833 | A | * 12/1982 | |
| WO | WO-2014128018 | A1 | * 8/2014 | G01K 15/005 |
| WO | WO-2022235215 | A1 | * 11/2022 | G01K 15/005 |

OTHER PUBLICATIONS

17452224_2024-08-06_JP_57207833_A_H.pdf, Dec. 20, 1985.*
17452224_2024-08-06_WO_2014128018_A1_H.pdf,Aug. 28, 2014.*
17452224_2024-08-06_WO_2022235215_A1_H.pdf,Nov. 10, 2022.*
17452224_2024-08-07_GB_2475123_A_H.pdf,May 11, 2011.*

* cited by examiner

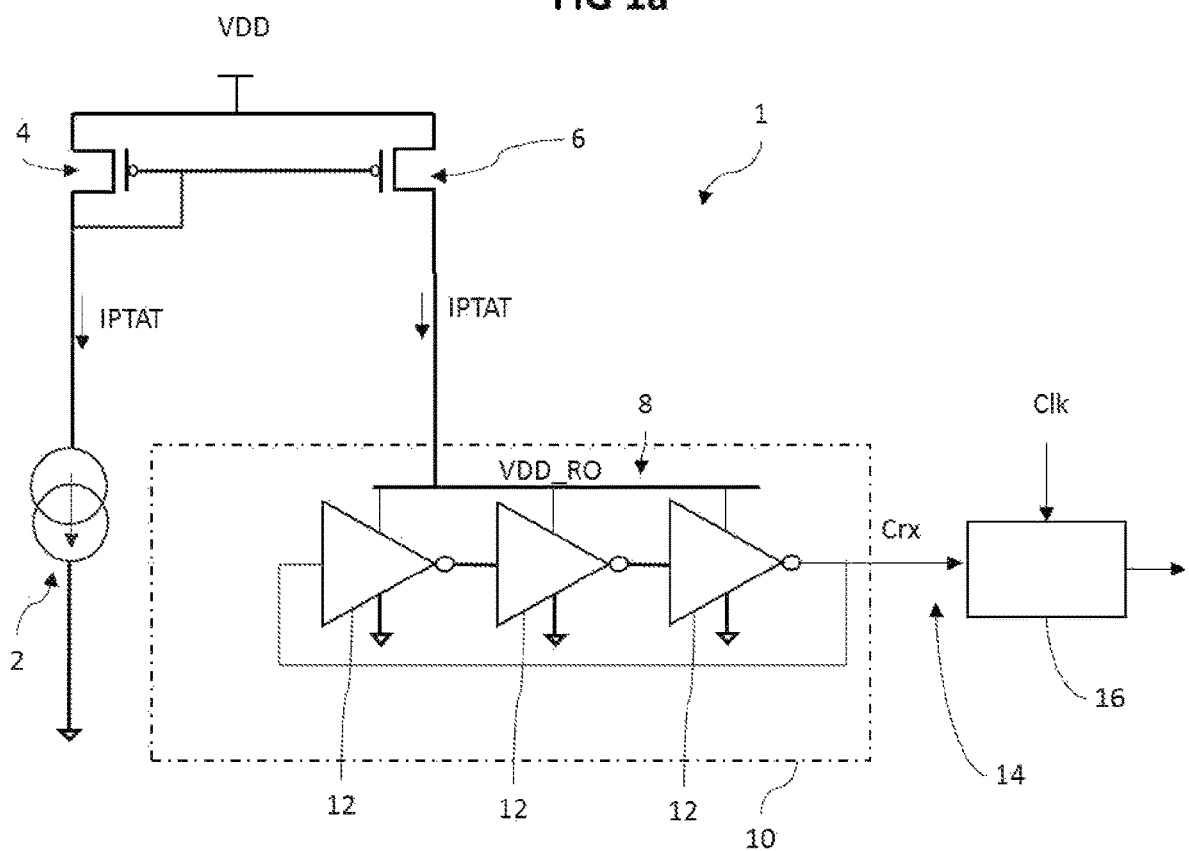

FIG 2
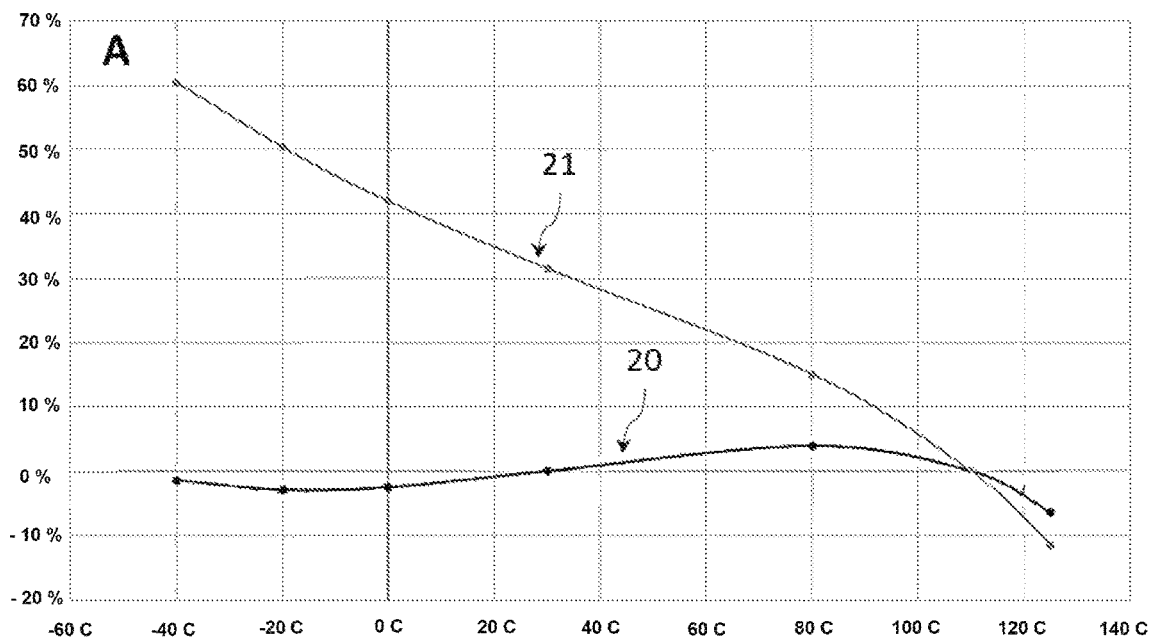
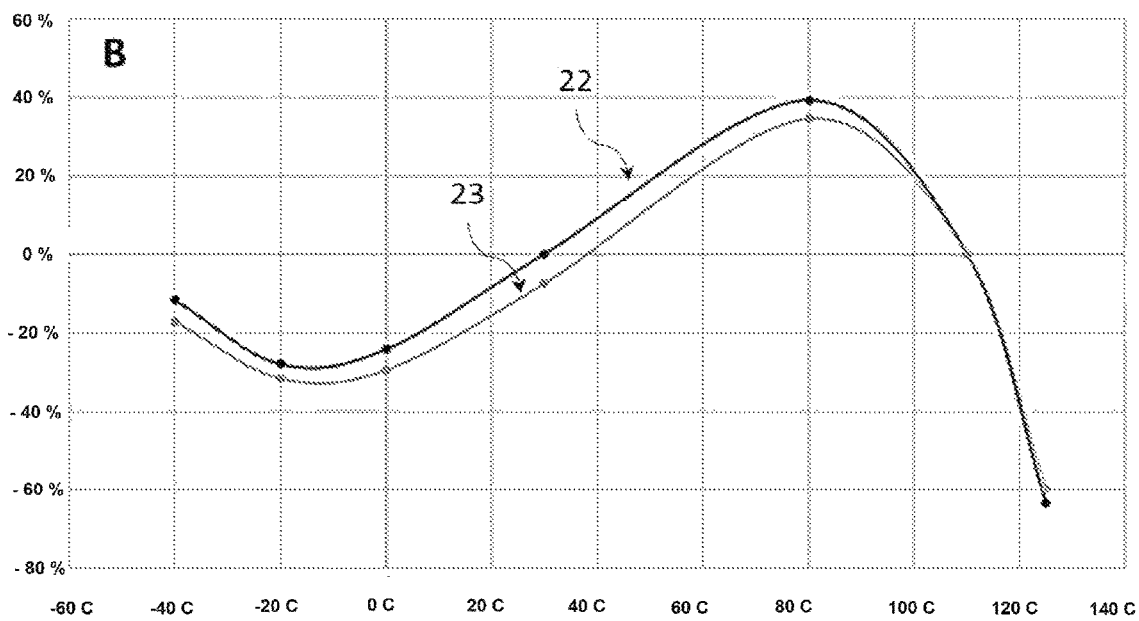

FIG 6
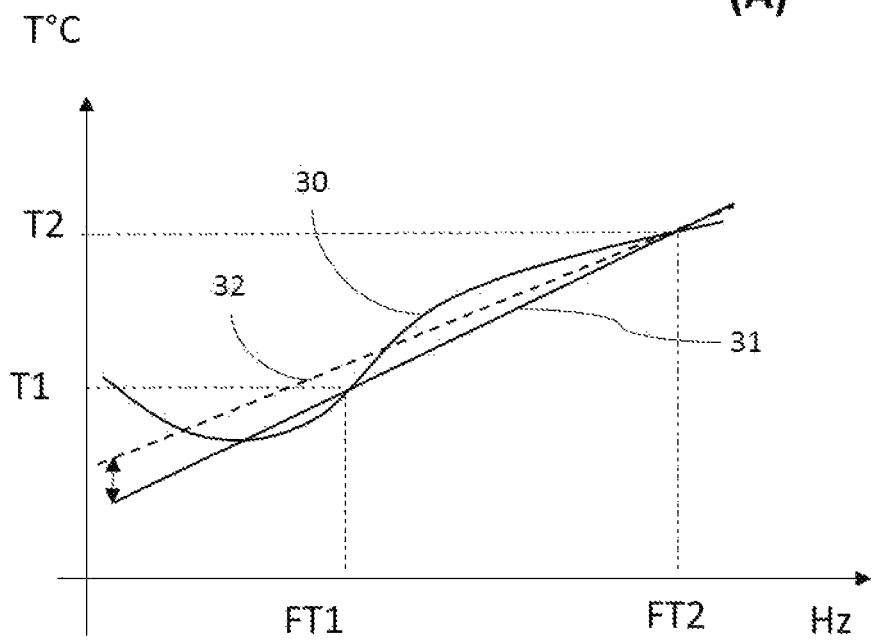
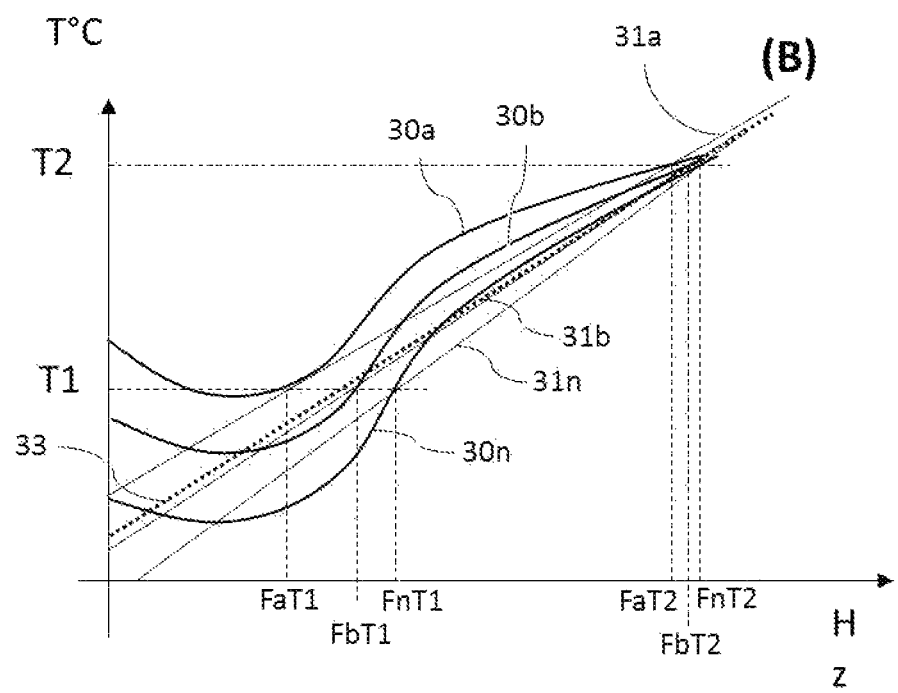

FIG 7
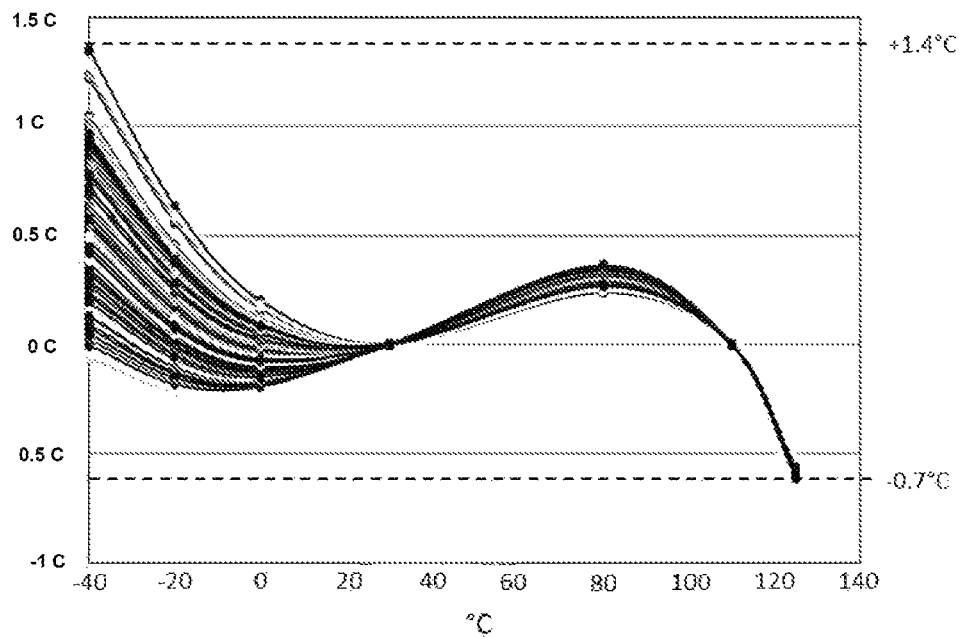
(A)
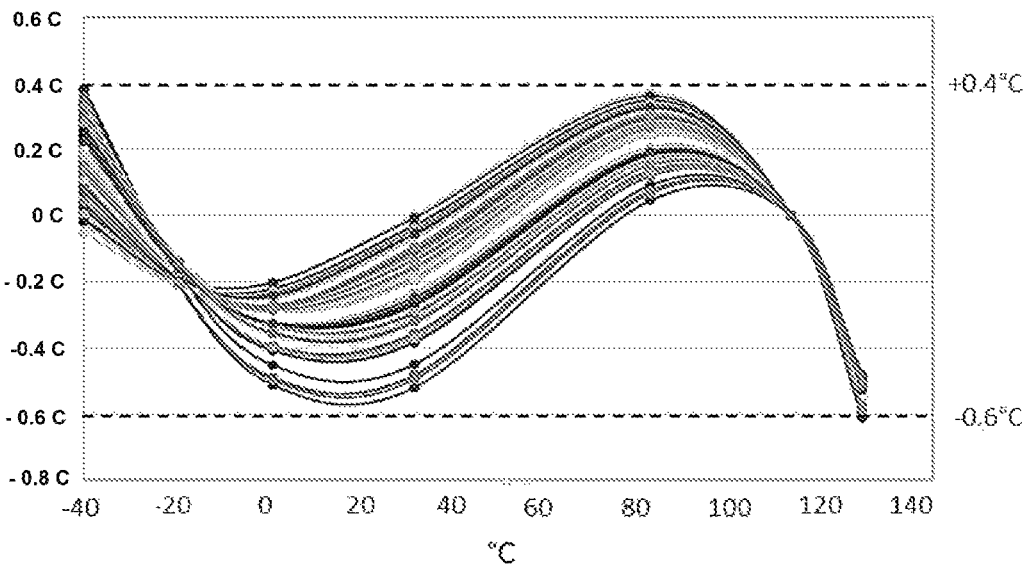
(B)

ENHANCED TEMPERATURE SENSOR

CROSS-REFERENCE TO RELATED APPLICATIONS

This application claims priority to French Patent Application No. 2012056, filed on Nov. 24, 2020, which application is hereby incorporated by reference herein in its entirety.

TECHNICAL FIELD

The present disclosure relates to the field of electronic circuits, and more particularly to the temperature measurement integrated into an electronic circuit through a temperature sensor that includes a ring oscillator.

BACKGROUND

For an electronic circuit (particularly for microcontrollers), accurate knowledge of the circuit temperature is advantageous. Indeed, the characteristics of many electronic components are influenced by the temperature to which the components are submitted. Further, the monitoring of certain temperatures may be used to detect attacks aiming to compromise the electronic circuit's security by placing it under extreme temperature conditions. For multiple reasons, the accuracy of the temperature knowledge is thus advantageous.

SUMMARY

It is advantageous to have a temperature sensor calibration method, device, or both.

For this purpose, a method of calibration of a temperature sensor is provided. The temperature sensor includes a current source configured to transmit an excitation signal proportional to a temperature-dependent current. A ring oscillator that includes inverters in series is configured to be powered with the excitation signal and to generate a square pulse signal with a square pulse frequency depending on the excitation signal. The temperature is determined by relation data establishing a relation between square pulse frequencies and temperatures.

The calibration method includes acquiring a first measurement of the frequency of square pulses of the ring oscillator from the square pulse signal when the temperature sensor is placed at the first temperature. The first square pulse frequency measurement and the first temperature form the first measurement point of the ring oscillator. The method further includes acquiring a second measurement of the frequency of square pulses of the ring oscillator from the square pulse signal when the temperature sensor is placed at the second temperature—the second temperature being higher than the first temperature. The second square pulse frequency measurement and the second temperature form a second measurement point of the ring oscillator. The method further includes, from the first measurement point of the ring oscillator and from the second measurement point of the ring oscillator, determining the relation data representative of an affine relation between square pulse frequency measurements and temperatures. The affine relation is defined by a used proportionality coefficient modified with respect to a measured proportionality coefficient of a measured affine relation linking the first measurement point of the ring oscillator and the second measurement point of the ring oscillator.

The method completed by the following different features, taken alone or in their different possible combinations, provides multiple advantages.

The square pulse frequency increases with temperature, the measured proportionality coefficient is positive, and the used proportionality coefficient is smaller than the measured proportionality coefficient.

The measured proportionality coefficient and the used proportionality coefficient have the same sign.

The used proportionality coefficient is determined by subtracting to the measured proportionality coefficient a quantity which is a function of the measured proportionality coefficient.

The relation data establishing a relation between square pulse frequencies and a temperature are determined without using other measurement points than the first measurement point and the second measurement point.

The second temperature is higher than the first temperature by at least 50° C.

The relation data includes the used proportionality coefficient, or the relation data includes a table of square pulse frequency, where temperature pairs are constructed from the used proportionality coefficient.

The temperature sensor may include a plurality of ring oscillators, each ring oscillator having inverters in series configured to be supplied with the excitation signal and to generate a square pulse signal with a square pulse frequency depending on the excitation signal.

The ring oscillators differ from one another by channel width/length ratios of transistors forming the inverters of each ring oscillator. A first square pulse frequency measurement at the first temperature is acquired for each ring oscillator. A second square pulse frequency measurement at the second temperature is also acquired for each ring oscillator. Each ring oscillator having a first measurement point and a second measurement point.

The method may then further include the steps of determining, for each of the ring oscillators, a measured proportionality coefficient of the ring oscillator of a measured affine relation coupling the first measurement point of the ring oscillator and the second measurement point of the ring oscillator. Further, selecting a measured proportionality coefficient based on proximity of the measured proportionality coefficient with a previously-defined target proportionality coefficient, before the determination of relation data representative of an affine relation between square pulse frequency measurements and temperatures.

The disclosure also concerns a temperature sensor that includes a current source configured to transmit an excitation signal proportional to a temperature-dependent current. The ring oscillator includes inverters in series configured to be supplied with the excitation signal and to generate a square pulse signal with a square pulse frequency depending on the excitation signal, a memory storing relation data representative of an affine relation between square pulse frequency measurements and temperatures, the temperature sensor being calibrated by the calibration method according to the disclosure, and the relation data establish an affine relation defined by a used proportionality coefficient which is modified with respect to a measured proportionality coefficient of a measured affine relation linking the first measurement point and the second measurement point of the calibration method.

The temperature sensor may include a plurality of ring oscillators; each ring oscillator having inverters in series configured to be supplied with the excitation signal and to generate a square pulse signal with a square pulse frequency depending on the excitation signal. The ring oscillators differing from one another by channel width-to-length ratios of transistors forming the inverters of each ring oscillator.

BRIEF DESCRIPTION OF THE DRAWINGS

For a more complete understanding of the present disclosure and the advantages thereof, reference is now made to the following descriptions taken in conjunction with the accompanying drawings, in which:

FIG. 1a is a simplified view of components of the temperature sensor, according to a possible embodiment of the disclosure with a cascode-less current mirror;

FIG. 2 shows graphs, which disclose the temperature error of the sensor according to temperature for different power supply voltages with no cascode (graph A) and with a cascode (graph B).

FIG. 6 graphically shows relations between the square pulse frequency measurements and temperature for the case of a single oscillator (graph A) and a plurality of oscillators (graph B); and FIG. 7 is a graph showing the dispersion of the errors on the temperature measured by the temperature sensor, according to temperature before (graph A) and after (graph B) their compensation by the calibration.

DETAILED DESCRIPTION OF ILLUSTRATIVE EMBODIMENTS

The U.S. patent application Ser. No. 14/760,762 describes a temperature sensor having an oscillator adapted to alternately generating a temperature-dependent output frequency in a detection mode and an output frequency independent from the temperature in a calibration mode. A controller is adapted to supplying the oscillator with at least one first input signal (VREF) and changing the first input signal (VREF) to switch the oscillator between the generation of a temperature-dependent output frequency and the generation of an output frequency independent from temperature. However, this temperature sensor has several disadvantages; in particular, the temperature sensor induces a non-negligible electric power consumption and includes many components likely to introduce inaccuracies, such as the presence of the comparator, which introduces nonlinearities.

Figure 1B:
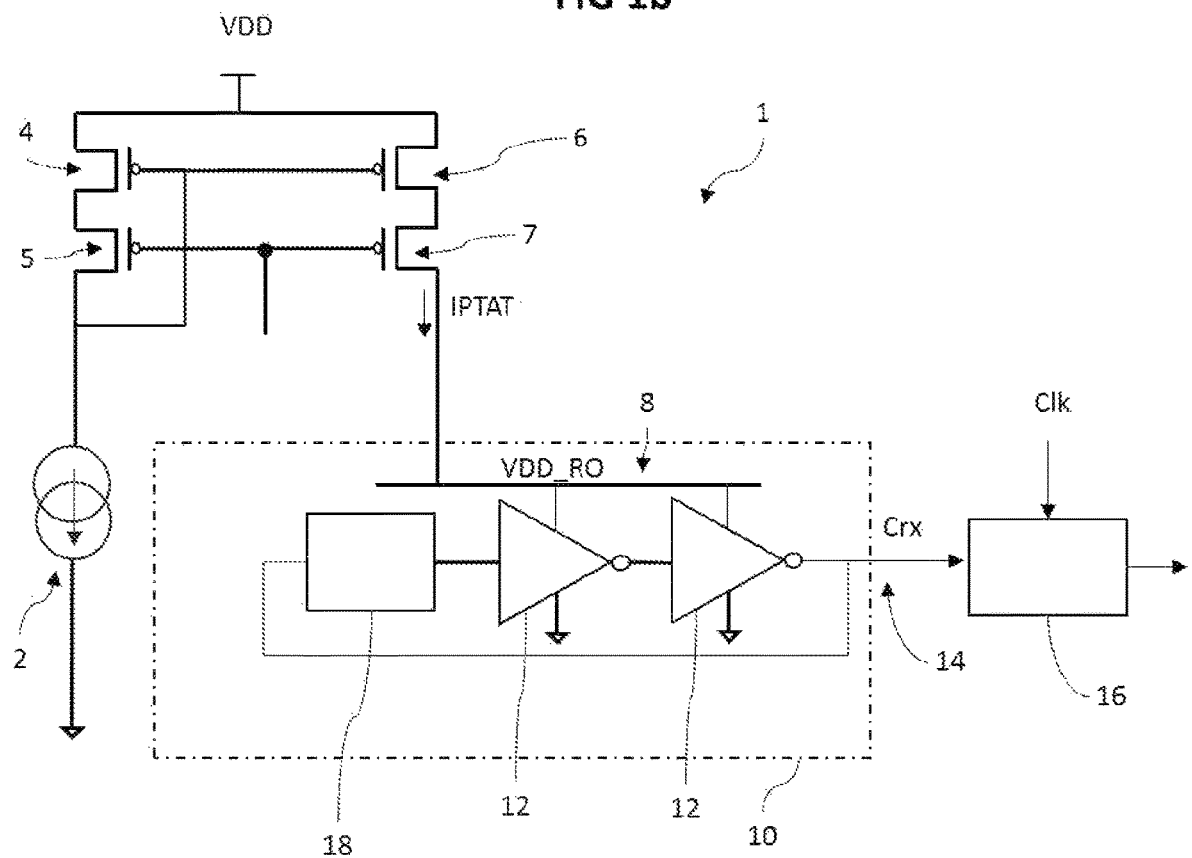
FIG. 1b is a simplified view of components of the temperature sensor, according to a possible embodiment of the disclosure with a cascode current mirror.

FIGS. 1a and 1b are simplified views of components of a temperature sensor (1), with a cascode-less and a cascode current mirror, respectively. Temperature sensor (1) includes a current source (2) configured to emit a current proportional to temperature. The temperature-dependent current is representative, and preferably proportionally, of the absolute temperature of the electronic circuit having its temperature measured, and which integrates temperature sensor (1). It will be within the abilities of those skilled in the art to implement this current, several solutions being known in the art.

The current sensor includes a first transistor (4), typically a field-effect transistor, preferably PMOS as in the example, and a second transistor (6), typically a field-effect transistor, preferably PMOS as in the example. If transistors other than PMOS transistors are used, it is advantageous to accordingly modify the connections of the transistors described hereafter, particularly in the case of the use of a cascode circuit to strongly decrease the influence of the VDD power supply on the IPTAT output current.

The source terminals of the first transistor (4) and of the second transistor (6) are coupled together and connected to the power supply voltage VDD. The drain terminal of the first transistor (4) is coupled to current source (2). The gate terminal of the first transistor (4) is connected to its drain or to the drain of another transistor (5) in the case of a cascode circuit such as that in FIG. 1b, in which the other transistor (5) then is interposed between first transistor (4) and current source (2). The gate terminals of the first transistor (4) and second transistor (6) are coupled together so that the IPTAT current crossing the first transistor (4) is replicated in the current flowing through the second transistor (6), thus also designated as IPTAT. The drain terminal of the second transistor (6) is connected to a power supply node (8) having an excitation voltage VDD_RO thereon and having the IPTAT current forming an excitation signal transiting therethrough, or is connected to the source of another transistor (7) in the case of a cascode circuit such as that in FIG. 1b, the other transistor (7) being arranged between second transistor (6) and power supply node (8). The gate terminals of the transistor (5) and transistor (7) are connected together and may be connected to another component (not shown).

FIG. 2 shows two graphs to demonstrate the impact of the cascode in the current mirror on the temperature linearity of the sensor according to different values of power supply voltage VDD.

More specifically, graph A shows the error, in percentage, of the cascode-less temperature sensor according to temperature (in ° C.) for two different power supply voltages VDD: 1.1 V (curve 20) and 1.3 C (curve 21).

The bottom graph B shows the error, in percentage, of the cascode temperature sensor according to temperature (in ° C.) for two different power supply voltages VDD: 1.1 V (curve 22) and 1.3 V (curve 23).

As can be seen, the addition of the cascode enables to make the cell almost immune to the variation of power supply voltage VDD. Indeed, it is advantageous that the sensor, once calibrated, does not see its conversion function vary with its power supply voltage. The presence of a cascode is thus preferred.

Returning to FIGS. 1a and 1b, temperature sensor (1) includes a ring oscillator (10) configured to be supplied with the excitation signal and generate a square pulse signal Crx with a square pulse frequency depending on the excitation signal. Ring oscillator (10) includes power supply node (8) having the excitation signal (e.g., the IPTAT current) arriving thereon.

As illustrated in FIG. 1a, ring oscillator (10) includes an odd number of inverters (12) in series or in cascade, forming a ring. These inverters (12) are, for example, NOT, NOR, or NAND gates. Inverters (12) may be simple PMOS, NMOS, or CMOS gates, for example, according to the transistors with which they are formed, or also may be inverter differential amplifier assemblies.

Inverters (12) are biased—or powered—with the IPTAT current and thus with the excitation signal. Each inverter (12) outputs the logical negation of its input signal. In case of switching of the input signal, the output of an inverter (12), however, does not immediately switch. There is a switching delay, and this switching delay depends, among other parameters (particularly the width-to-length ratio W/L of the inverter), on the bias current intensity of inverter (12), and thus on the intensity of the temperature-dependent IPTAT current as an excitation signal.

The output signal of a cascade of an odd number of inverters (12) is the logical negation of the input signal. However, the ring connection, that is, a closed-loop, induces a feedback of the output signal, which generates the periodic oscillation phenomenon, which results in a square pulse signal (voltage) flowing through ring oscillator (10), characterized by a square pulse frequency. A ring oscillator (10) is besides sometimes designated as a square pulse generator.

The frequency of the square pulses depends on the bias currents of inverters (12), and thus here depends on the intensity of the temperature-dependent IPTAT current as an excitation signal. The square pulse frequency thus depends on temperature via the excitation signal. Generally, at high bias frequencies, this dependency is positive; that is, the square pulse frequency increases when the temperature increases.

The square pulse frequency also depends on the number of inverters (12) in the ring oscillator (10): the more inverters (12) there are, the more they introduce a significant delay and thus lower the square pulse frequency.

Three inverters (12) are illustrated in the example of FIG. 1a for simplification, but preferably the number of inverters (12) is greater than three, and is, for example, in the range from five to thirteen. The power supply voltage of oscillator VDD_RO may also be modulated to modify the square pulse frequency, a higher voltage decreasing the delays and thus increasing the frequency.

As illustrated in FIG. 1b, ring oscillator (10) may comprise a logic gate (18) arranged in the ring of the ring oscillator (10), replacing an inverter (12) and thus in series with the other inverters (12) in cascade. The sum of the number of inverters (12) and of logic gate (18) thus remains odd. Logic gate (18) is, for example, an OR or AND gate, controlled by a control signal (not shown), or a NOR or NAND gate.

Logic gate (18) may be used as a switch for ring oscillator (10), enabling, through the control signal, to start or to launch the oscillation, and thus the generation of the square pulse signal.

Typically, logic gate (18) is used to start ring oscillator (10) after the establishing of the IPTAT current, and to stop ring oscillator (10) before the interruption of the IPTAT current. It is possible to ensure thus that the square pulse frequency measurement is effectively representative of temperature, via an established IPTAT current, with no disturbance by transient effects. This configuration also enables to minimize the electric power consumption, since logic gate (18) enables only to use of ring oscillator (10) when the temperature is desired to be known, which most often occurs occasionally rather than continuously.

It should be noted that the cascade assembly is not linked to the presence or absence of logic gate (18) and that the differences between FIGS. 1a and 1b are only here to illustrate the possibilities. Logic gate (18) could replace an inverter (12) of FIG. 1a, and the ring oscillator (10) of FIG. 1b could have an odd number of inverters (12) with no logic gate (18).

Square pulse signal Crx may be sampled from an output (14) located at any point of the ring oscillator (10). Output (14) may be provided with components enabling not to disturb the oscillation in the ring oscillator (10), such as, for example, a buffer amplifier such as a voltage follower or a level shifter (not shown).

Square pulse signal Crx is a periodic AC signal in all or nothing, formed of a repetition of a pattern implying a high voltage level followed by a low voltage level. The alternation of transitions between high and low levels is performed according to a square pulse period, the inverse of which is a square pulse frequency. By construction, this square pulse frequency depends on temperature.

The square pulse signal Crx of output (14) is supplied to a counter (16), accounting for a counting value derived from level transitions in the square pulse signal. Counter (16) may be a flip-flop-based register circuit or may be of another type. Counter (16) may, for example, count each transition, only the rising or falling edges, or also only count a multiple thereof. The change in the square pulse signal Crx, which is taken into account by counter (16), is called event hereafter.

Counter (16) receives a clock signal Clk, which is independent of temperature, and which then includes a series of transitions between a high level and a low level, defining a clock frequency. Clock signal Clk is typically supplied by a clock generator; generally, an oscillator based on piezoelectric quartz, which may be integrated into the temperature sensor (1), or more advantageously belongs to the electronic circuit incorporating the temperature sensor (1), clock signal Clk being further used by other components of the electronic circuit.

Counter (16) is configured to count the number of events in square pulse signal Crx between two events of clock signal Clk. Typically, counter (16) is incremented for each event of square pulse signal Crx, and is reset for each event of clock signal Clk. The resulting counting value is thus directly representative of a ratio of the square pulse frequency to the clock frequency. Since the clock frequency is known and assumed to be constant, independent from temperature, the counting value enables to know the square pulse frequency and thus forms a square pulse frequency measurement. The occurrence of an event of clock signal Clk causes the reading of the counting value before the resetting of the counter (16). It thus enables to obtain a square pulse frequency measurement.

Typically, the square pulse frequency is higher than the clock frequency, and more particularly, is sufficiently high in its expected variation range so that over this entire variation range. A sufficient number of square pulse periods take place within a single clock period for the variation of the number of transitions during a clock period to deduce fine temperature variations therefrom.

The lower the clock frequency compared to the square pulse frequency, the more accurate the temperature determination. For example, the square pulse frequency may be greater by a factor of at least 1,000, preferably at least 10,000, than the clock frequency.

Conversely, the square pulse frequency can be lower than the clock frequency. In this case, counter (16) is configured to count the number of events of clock signal Clk between two events in square pulse signal Crx. The resulting counting value is still directly representative of a ratio of the square pulse frequency to the clock frequency, but with an inversion of the respective roles of clock signal Clk and of square pulse signal Crx with respect to those described hereabove.

As explained hereabove, a relation links the square pulse frequency and temperature so that a square pulse frequency measurement can be used to determine a temperature. For this purpose, relation data establish such a relation.

The relation data may be stored in a register or a computer memory (for example, of flash type) either of the actual temperature sensor (1), or in the electronic circuit receiving the temperature sensor (1), to allow the translation of the measurement of the square pulse frequency (for example, the counting value), into a temperature value.

For simplicity reasons, the relation data are, in the first order, representative of an affine relation between square pulse frequency measurements and temperatures, and the relation data may comprise a proportionality coefficient A to be applied to a square pulse frequency measurement to obtain a corresponding temperature.

The relation data generally also include at least one constant, used to obtain the temperature. For example, the temperature may directly result from the multiplication of the square pulse frequency measurement and of the addition of the constant. A plurality of constants may be stored, such as, for example, a reference frequency measurement (e.g., a reference counting value) and a corresponding reference temperature.

To obtain the temperature, an interval between the square pulse frequency measurement and a reference frequency measurement is multiplied by proportionality coefficient A to obtain an interval between the measured temperature and the reference temperature, which enables one to deduce the measured temperature.

Generally, the excitation signal varies positively with temperature, the square pulse frequency increases with temperature, and accordingly, proportionality coefficient A is positive.

The relation established by the relation data depends on the specific characteristics of each temperature sensor (1), and varies between two transistors according to their sizes and due to the inevitable manufacturing method variations. The relation data must thus be individually established for each temperature sensor (1), or at least for each manufacturing batch (for example, each "wafer"). It is therefore desirable to implement a calibration method to determine these relation data.

The fact for the relation data to establish an affine relation is essentially dictated by the fact that the data available to establish a relation between each square pulse frequency and a corresponding temperature are very limited. Generally, only two measurement points, a square pulse frequency measurement at a known temperature, are available for calibration. Typically, the two calibration measurement points are performed at temperatures to which the electronic circuits are submitted during a quality control to ascertain their proper operation at points representative of an operating range. These two measurements enable the determination of a proportionality coefficient A as well as the associated constant.

Figure 3:
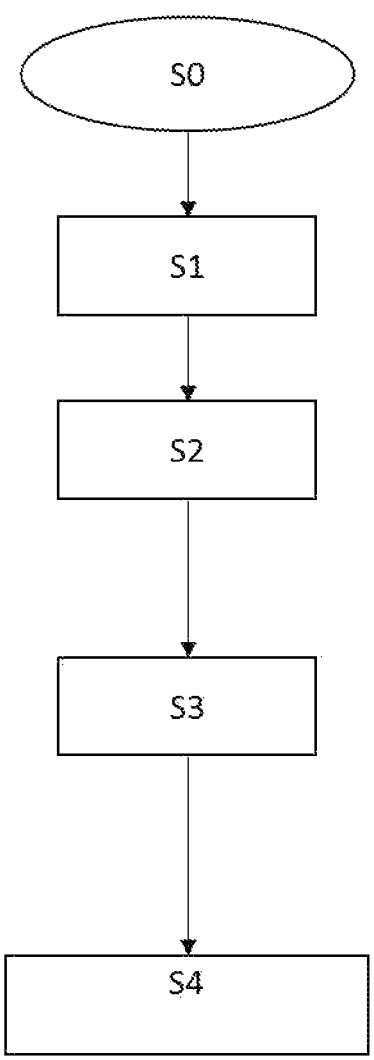
FIG. 3 is a simplified diagram illustrating steps of the calibration method according to a possible embodiment of the disclosure.

FIG. 3 is a simplified diagram illustrating steps of the calibration method according to a possible embodiment of the disclosure. The calibration method may previously implement a calibration of current source (2) (step S0), described in further detail hereafter.

Temperature sensor (1) is placed at a first temperature T1. The method includes the acquisition (step S1) of a first square pulse frequency measurement FT1 at first temperature T1 from a square pulse signal when temperature sensor (1) is placed at the first temperature T1. The first square pulse frequency measurement FT1 and first temperature T1 form a first measurement point. First square pulse frequency measurement FT1 and first temperature T1 are stored.

Temperature sensor (1) is placed at a second temperature T2. The calibration method includes the acquisition (step S2) of a second square pulse frequency measurement FT2 at second temperature T2 from the square pulse signal when temperature sensor (1) is placed at second temperature T2. The second square pulse frequency measurement FT2 and second temperature T2 form a second measurement point, and may also be stored, or may be directly processed in the determination of the relation data.

First temperature T1 and second temperature T2 are different, and, thereby, one temperature is lower than the other temperature. First temperature T1 is here, but not necessarily, designated as being lower than second temperature T2. The designations of the first and second enable to distinguish the measurement points and do not prejudge the order in which the two measurement points are acquired.

First temperature T1 and second temperature T2 are preferably sufficiently distant to represent the extent of the electronic circuit operating temperature range. Preferably, second temperature T2 is higher than first temperature T1 by at least 50° C., preferably by at least 70° C. For example, the first temperature T1 may be in the range from 10° C. to 40° C., and the second temperature may be in the range from 100 to 150° C. Of course, these are indications only, the temperatures depending on the type of electronic circuit, on its applications, and above all on the temperatures at which the tests are carried out.

As indicated, before the acquisition of the first square pulse frequency measurement FT1 and second square pulse frequency measurement FT2, it is possible to implement a calibration of the current source (2), and more particularly, a calibration (step S0) which enables to determine the resistance value R involved in the ratio of the temperature-dependent IPTAT current to the temperature-dependent voltage VPTAT (IPTAT=VPTAT/R). Such calibration of resistance value R is performed at a given and known temperature, which is either first temperature T1 or second temperature T2.

The resistance value R, which is determined, is stored and may form part of the relation data establishing a relation between each square pulse frequency and a temperature. However, it is no longer needed to calibrate the comparator in the absence thereof.

The two measurement points of the ring oscillator (10) define the measured proportionality coefficient A of a measured affine relation coupling the first measurement point and the second measurement point: $A=(T2-T1)/(FT2-FT1)$.

The determination of the relation data includes determining a used proportionality coefficient A' (step S3) modified with respect to the measured proportionality coefficient A. Then, the used proportionality coefficient A' thus determined is stored and used for the relation data (step S4). This determination of the used proportionality coefficient A' may be indirect in that it first implies a determination of the measured proportionality coefficient A, or direct, without implying a determination of the measured proportionality coefficient A. These steps S3, S4 will be described in further detail in relation with FIGS. 6 and 7.

The frequency-vs-temperature relation of a temperature sensor generally takes a more complex form than a simple affine relation, the latter being an approximation only, and the temperatures of the two measurement points are generally not determined by their ability to correctly account for the frequency-vs-temperature relation when the temperatures diverge from the temperatures used for the measurement points.

The exact of the measured proportionality coefficient A depends on many characteristics of the temperature sensor (1) and may exhibit non-negligible variations, which justifies the need for calibration. In particular, the structure of the transistors forming the inverters of each ring oscillator notably influences this measured proportionality coefficient A. In addition to accurately knowing the value of the measured proportionality coefficient A, it may be desirable to be capable of guaranteeing for this value of the measured proportionality coefficient A to be close to a target value. For this purpose, it is desirable to select, to a certain extent, this value of the measured proportionality coefficient A despite possible variations.

Figure 4:
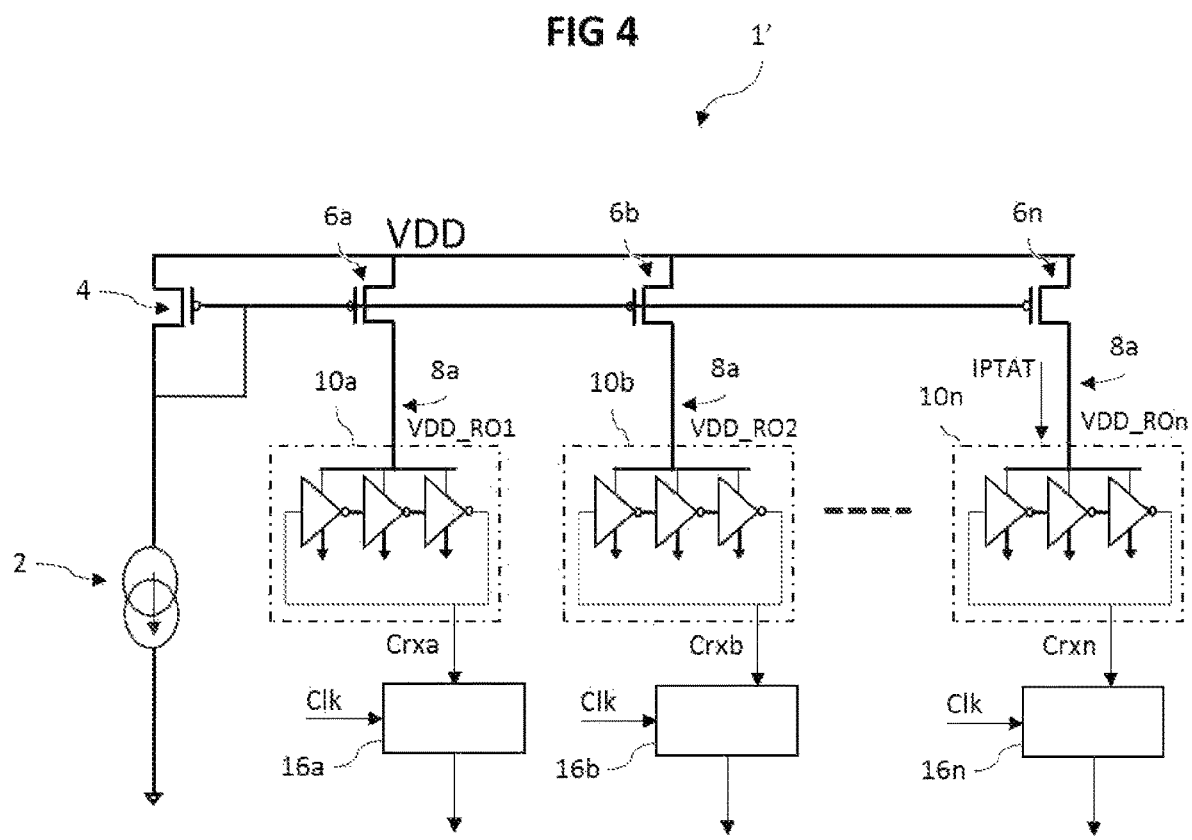
FIG. 4 is a simplified view of a temperature sensor according to a possible embodiment of the disclosure, having a plurality of ring oscillators arranged therein.

FIG. 4 is a simplified view of a temperature sensor (1)' according to a possible embodiment of the disclosure, where a plurality of oscillators is arranged in a ring. As an example, the illustrated configuration is that of FIG. 1a, but that of FIG. 1b may be preferably be used or another configuration. The difference with the previous configurations lies in the fact that temperature sensor (1)' includes a plurality of ring oscillators 10a, 10b, . . . , and 10n configured to be supplied with the same IPTAT current forming an excitation signal, and to each generate a square pulse signal Crxa, Crxb, . . . , and Crxn with a respective square pulse frequency.

Ring oscillators 10a, 10b, . . . , and 10n differ from one another by their channel width-to-length, or W/L, ratios of the transistors forming the inverters of each ring oscillator. For example, a first ring oscillator 10a may have inverters with a W/L ratio of 15 µm to 0.4 µm, a second oscillator 10b may have inverters with a W/L ratio of 8 µm to 0.4 µm, and another oscillator may have inverters with a W/L ratio of 10 µm to 0.25 µm, etc. Thus, each ring oscillator (10)a, 10b, . . . , and 10n has a W/L ratio which is specific thereto and which differs from that of the others. The width, length, or both may be different between two ring oscillators 10a, 10b, . . . , and 10n.

Preferably, the number n of ring oscillators 10a, 10b, . . . , and 10n in a same temperature sensor (1)' is smaller than ten, and preferably smaller than five, to avoid consuming too much surface area. Typically, from two to four ring oscillators 10a, 10b, . . . , and 10n are present. Preferably, all ring oscillators 10a, 10b, . . . , and 10n are used during the calibration, but it is possible not to use them all. The different W/L ratios of the inverters of these ring oscillators 10a, 10b, . . . , and 10n are selected to span a range of variation of the value of measured proportionality coefficient A which is likely to cover a value corresponding to a target proportionality coefficient $A_{target}$, which is a target value previously defined on design (by simulation) or by characterization of a determining number of parts.

As previously, the generation of the IPTAT current is performed through a current mirror, implying a current source (2) connected to the drain of a first transistor (4). The gate terminal of this first transistor (4) is connected to its drain terminal, and to each of the gate terminals of a plurality of second transistors 6a, 6b, . . . , and 6n, each arranged on a branch having the IPTAT current flowing therethrough. Each branch forms a power supply node (8)a, 8b, . . . , and 8n having a drain of a second transistor (6)a, 6b, . . . , and 6n connected thereto, and having an excitation voltage VDD_RO1, VDD_RO2, . . . , and VDD_ROn specific to each ring oscillator (10)a, 10b, . . . , and 10n applied thereto. The excitation voltages take different values due to the variations of the behavior of ring oscillators 10a, 10b, . . . , and 10n induced by their W/L ratio differences.

Figure 5:
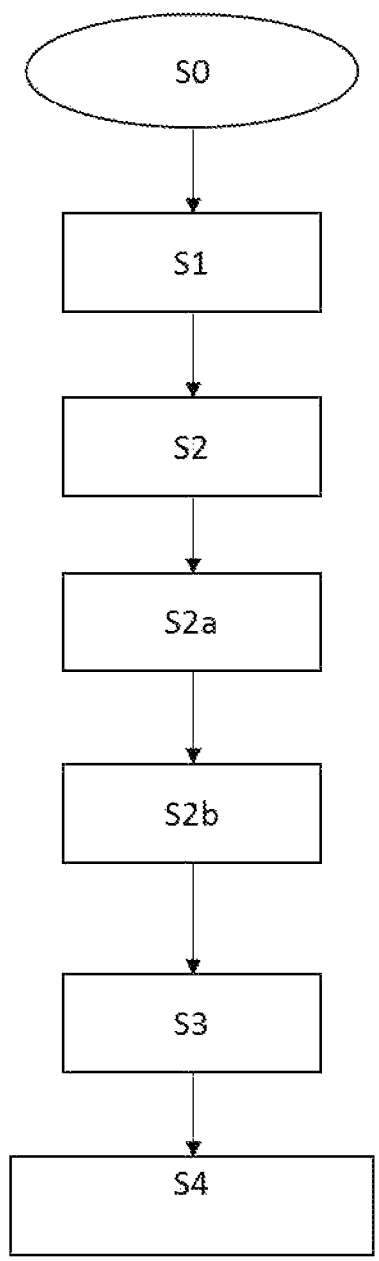
FIG. 5 is a simplified diagram illustrating steps of the calibration method according to a possible embodiment of the disclosure when there is a plurality of ring oscillators.

FIG. 5 is a simplified diagram illustrating steps of the calibration method according to a possible embodiment of the disclosure when there is a plurality of ring oscillators, as shown in FIG. 4.

The calibration method then includes the same steps S1 and S2 as previously, except that the square pulse frequencies of each ring oscillator (10)a, 10b, . . . , and 10n are measured at temperatures T1 and T2. At step S1, as many square pulse frequency measurements FaT1, FbT1, . . . , and FnT1 at first temperature T1 as there are ring oscillators 10a, 10b, . . . , and 10n are acquired and, of course, at step S2, as many square pulse frequency measurements FaT2, FbT2, . . . , and FnT2 at second temperature T2 as there are ring oscillators 10a, 10b, . . . , and 10n are acquired. There are thus as many first measurement points as ring oscillators 10a, 10b, . . . , and 10n, and as many second measurement points as ring oscillators 10a, 10b, . . . , and 10n.

The calibration method then includes a step Sea where a measured proportionality coefficient Aa, Ab, . . . , and An is determined for each of ring oscillators 10a, 10b, . . . , and 10n from the measurement points of the ring oscillators 10a, 10b, . . . , and 10n. There are thus as many measured proportionality coefficients Aa, Ab, . . . , and An as ring oscillators 10a, 10b, . . . , and 10n. The two measurement points of each ring oscillator (10)a, 10b, . . . , and 10n define a measured proportionality coefficient Ai of a measured affine relation coupling the first measurement point of the ring oscillator (10)a, 10b, . . . , and 10n and the second measurement point of the ring oscillator (10)a, 10b, . . . , and 10n: Ai=(T2−T1)/(FiT2−FiT1), avec i=a, b, . . . , n.

FIG. 6 graphically shows relations between the square pulse frequency measurements (in Hertz in abscissas) and temperature (in ° C. in ordinates) for the case of a single ring oscillator (upper graph (A)). For a plurality of ring oscillators (lower graph (B)) In the upper graph (A), curve 30 shows a simplified example of a real relation between the temperatures and the square pulse frequencies of a ring oscillator (10). It also features the first measurement point (T1, FT1) and the second measurement point (T2, FT2) of this ring oscillator, which defines the straight line 31 in a full line running through these two measurement points, and having as a slope the proportionality coefficient A measured for this ring oscillator (10).

On the lower graph (B), curves 30a, 30b, . . . , and 30n show simplified examples of real relations between the temperatures (in ° C. in ordinates) and the square pulse frequencies (in Hertz in abscissas) of a plurality of ring oscillators 10a, 10b, . . . , and 10n of a temperature sensor (1)'. A same first temperature T1 has a plurality of corresponding first square pulse frequency measurements FaT1, FbT1, . . . , and FnT1 corresponding thereto, and a second temperature T2 has a plurality of second square pulse frequency measurements FaT2, FbT2, . . . , and FnT2 corresponding thereto, which enables to show as many straight lines 31a, 31b, . . . , and 31n in a full line running through the pairs of measurement points and having as a slope the proportionality coefficient Ai measured for each ring oscillator (10)a, 10b, . . . , and 10n.

During a selection step S2b, it is then proceeded to select a measured proportionality coefficient Ai from among the measured proportionality coefficients Ai thus determined. The measured proportionality coefficient Ai is selected as being that which is closest to the previously defined target proportionality coefficient $A_{target}$.

In the example of the lower graph (B) of FIG. 6, straight-line 33 (in dotted lines) has as a slope the target proportionality coefficient $A_{target}$. The straight-line closest to this straight-line 33 is the straight-line 31b, which has as a slope the measured proportionality coefficient Ab of second ring oscillator (10)b, defined by measurement points (T1, FbT1)

and (T2, FbT2). This measured proportionality coefficient Ab is thus selected as the new measured proportionality coefficient A.

More methodically, FIG. 7 shows, in the form of curves, the simulation results of a plurality of real relations linking square pulse frequency measurements and temperatures, based on the expected variations of characteristics impacting this relation.

In the upper graph (A) of FIG. 7, the curves show the temperature error (in ° C.) (in ordinates) resulting from the approximation by the measured affine relation with the measured proportionality coefficients A, for seven temperatures, ranging from −40° C. to 130° C. The two measurement points correspond to the 30° C. and 110° C. temperatures, and thus logically, the errors are null for these temperatures. It can be observed that if the approximation exhibits small errors for high temperatures (greater than or equal to 30° C.), the errors substantially increase for low temperatures (lower than 20° C.), in particular for temperatures close to or below zero.

Accordingly, rather than using measured proportionality coefficient A, the calibration method, based on the first measurement point and on the second measurement point, determines (step S3) a used proportionality coefficient A', derived from the measured proportionality coefficient A but different therefrom.

Like the measured proportionality coefficient A, the used proportionality coefficient A' defines an affine relation between two square pulse frequency measurements and temperatures, but the used proportionality coefficient A' is modified with respect to the measured proportionality coefficient A of the measured affine relation linking the first measurement point and the second measurement point. More particularly, the used proportionality coefficient A' is deduced from the two measurement points at the two temperatures T1, T2 and from a theoretical proportionality coefficient $A_{max}$ previously defined on design (by simulation) or by characterization of a determining number of parts. The used proportionality coefficient A' defines a more accurate affine relation than the measured proportionality coefficient A between square pulse measurement frequencies and temperatures, that is, with a less significant error over a usage range.

The method may comprise a step of adjusting the measured proportionality coefficient A to decrease the temperature error for temperatures lower than first temperature T1. In the case where the square pulse frequency increases with temperature, the used proportionality coefficient A' is smaller than the measured proportionality coefficient A, but has the same sign. For this purpose, the measured proportionality coefficient A is modified by subtracting to the measured proportionality coefficient A a quantity which is a function of the measured proportionality coefficient A, smaller than the measured proportionality coefficient A.

For example, the used proportionality coefficient A' may correspond to: $A'=A-K(A_{max}-A)$, K being a positive constant factor and $A_{max}$ the previously-defined theoretical proportionality coefficient. Positive constant factor K and theoretical proportionality coefficient $A_{max}$ are selected so that the used proportionality coefficient A' keeps the same sign as the measured proportionality coefficient A. Preferably, positive constant factor K is strictly in the range from zero to two, and preferably still, positive constant factor K is strictly in the range from zero to one.

In direct fashion, it is possible to directly determine the used proportionality coefficient A' from the measurement points, with no intermediate determination of measured proportionality coefficient A, by replacing in the formula of the previous paragraph A with (T2−T1)/(FT2−FT1).

In the upper graph (A) of FIG. 6, the straight line 32 (in dashed lines) corresponding to the affine relation between square pulse frequency measurements and temperatures, defined by the used proportionality coefficient A' modified with respect to the measured proportionality coefficient A of the measured affine relation linking the first measurement point and the second measurement point, shown by a straight line 31 (in full line).

The used proportionality coefficient A' thus determined is used to determine (step S4) the relation data. These relation data, representative of an affine relation between square pulse frequency measurements and temperatures, are stored in a memory and used during subsequent temperature measurements. The used proportionality coefficient A' may be used as relation data, typically when temperature T is subsequently deduced from a frequency measurement FM: $T=A'\cdot FM+B$, B being a constant also forming part of the relation data, and, for example, corresponding to $B=(T1\cdot FT2-T2\cdot FT1)/(FT2-FT1)$. It is also possible for the relation data to contain neither the used proportionality coefficient A' nor constant B, but, instead, for the relation data to contain a lookup table between the square pulse frequency measurement and the temperature, constructed by using the used proportionality coefficient A' and constant B.

The lookup table stores a plurality of square pulse frequency-temperature measurement pairs, which are determined due to the used proportionality coefficient A' and the two measurement points (for example, via constant B). It is possible for a sufficient number of pairs to be available for each frequency measured to be directly assigned an associated temperature. It is otherwise possible to implement an interpolation between the two square pulse measurement—temperature pairs surrounding a specific square pulse frequency measurement that has just been measured.

After the calibration, during the operational use of temperature sensor (1), the relation data representative of an affine relation between square pulse frequency measurements and temperatures are stored and used, the affine relation being defined by the used proportionality coefficient A' and not by the measured proportionality coefficient A of the measured affine relation linking the first measurement point and the second measurement point. This calibration enables to decrease the error affecting the temperature sensor (1) for low temperatures, that is, lower than the first temperature of the first measurement point.

The lower graph (B) of FIG. 7 shows in the form of curves the simulation results of a plurality of real relations linking square pulse frequency measurements and temperatures, based on the expected variations of characteristics impacting this relation. The curves of the lower graph (B) of FIG. 7 show the temperature error (in ° C.) (in ordinates) resulting from the approximation by the used proportionality coefficient A', for seven temperatures, ranging from −40° C. to 130° C. It can be observed that the maximum error is smaller than that of FIG. 7(A). More particularly, the errors in the upper graph (A) extend over a range from +1.4° C. to −0.7° C., while the errors in the lower graph (B) extend over a range from +0.4° C. to −0.6° C., that is, more than twice smaller than the range obtained with no correction of the measured proportionality coefficient A.

After the calibration, the relation data are stored in temperature sensor (1) or in the electronic circuit integrating the temperature sensor (1). When the temperature is desired to be known, a current source (2) starts by establishing the IPTAT current, and then the ring oscillator (10) is started through a logic gate (18). The output square pulse signal (14) is delivered to counter (16), which determines a square pulse frequency measurement in the form of a counting value, after which this square pulse frequency measurement is translated into temperature through relation data, for example, a calculator. The temperature thus measured can be used. Ring oscillator (10) is then stopped by a logic gate (18).

The disclosure is not limited to the described embodiment shown in the accompanying drawings. Modifications remain possible, particularly from the point of view of the constitution of the various technical characteristics or by substitution of technical equivalents without for all this departing from the scope of the disclosure.

Although the description has been described in detail, it should be understood that various changes, substitutions, and alterations may be made without departing from the spirit and scope of this disclosure as defined by the appended claims. The same elements are designated with the same reference numbers in the various figures. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

The specification and drawings are, accordingly, to be regarded simply as an illustration of the disclosure as defined by the appended claims, and are contemplated to cover any and all modifications, variations, combinations, or equivalents that fall within the scope of the present disclosure.

What is claimed is:

1. A method for calibrating a temperature sensor, the method comprising:
    transmitting, by a current source, an excitation signal proportional to a temperature-dependent current;
    generating, by inverters of a ring oscillator, square pulse signals based on the excitation signal, each square pulse signal having a corresponding square pulse frequency, and the inverters being powered by the excitation signal; and
    determining a temperature based on a relation data comprising:
        acquiring a first measurement of a frequency of square pulses from a square pulse signal in accordance with the temperature sensor being at a first temperature, the first measurement and the first temperature forming a first measurement point,
        acquiring a second measurement of a frequency of square pulses from a square pulse signal in accordance with the temperature sensor being at a second temperature higher than the first temperature, the second measurement and the second temperature forming a second measurement point, and
        determining, from the first measurement point and the second measurement point, the relation data, the relation data being representative of an affine relation between square pulse frequency measurements and temperatures, the affine relation defined by a used proportionality coefficient modified with respect to a measured proportionality coefficient of a measured affine relation linking the first measurement point and the second measurement point.

2. The method of claim 1, wherein a representative square pulse frequency increases with temperature, the measured proportionality coefficient being positive, and the used proportionality coefficient being smaller than the measured proportionality coefficient.

3. The method of claim 1, wherein the measured proportionality coefficient and the used proportionality coefficient have the same sign.

4. The method of claim 1, further comprising determining the used proportionality coefficient by subtracting a quantity which is a function of the measured proportionality coefficient to the measured proportionality coefficient.

5. The method of claim 1, wherein the relation data is determined without using other measurement points apart from the first measurement point and the second measurement point.

6. The method of claim 1, wherein the second temperature is higher than the first temperature by at least 50° C.

7. The method of claim 1, wherein the relation data comprises the used proportionality coefficient, or the relation data comprises a table of square pulse frequency comprising temperature pairs constructed from the used proportionality coefficient.

8. The method of claim 1, wherein the temperature sensor comprises the current source, and the ring oscillator, the ring oscillator comprising inverters, and the inverters being arranged in series.

9. The method of claim 8, wherein the temperature sensor further comprises a plurality of ring oscillators, each ring oscillator having inverters arranged in series configured to be supplied with the excitation signal and to generate a square pulse signal with a square pulse frequency depending on the excitation signal, the ring oscillators differing from one another by channel width-to-length ratios of transistors forming the inverters of each ring oscillator, a first square pulse frequency measurement at the first temperature being acquired for each ring oscillator, and a second square pulse frequency measurement at the second temperature being acquired for each ring oscillator, each ring oscillator having a first measurement point and a second measurement point, the method further comprising:
    determining, for each of the ring oscillators, a measured proportionality coefficient of the each ring oscillator of a measured affine relation coupling the first measurement point of the each ring oscillator and the second measurement point of the each ring oscillator, and
    selecting a measured proportionality coefficient based on a proximity of the measured proportionality coefficient with a previously-defined target proportionality coefficient, before the determination of the relation data.

10. A temperature sensor, comprising:
    a current source configured to transmit an excitation signal proportional to a temperature-dependent current;
    a ring oscillator comprising inverters arranged in series configured to be supplied with the excitation signal and generate a square pulse signal with a square pulse frequency depending on the excitation signal; and
    a memory configured to store relation data representative of an affine relation between square pulse frequency measurements and temperatures, the temperature sensor configured to:
        acquire a first measurement of a frequency of square pulses from a square pulse signal in accordance with the temperature sensor being at a first temperature, the first measurement and the first temperature forming a first measurement point, acquire a second measurement of a frequency of square pulses from a square pulse signal in accordance with the temperature sensor being at a second temperature higher than the first temperature, the second measurement and the second temperature forming a second measurement point, and determine, from the first measurement point and the second measurement point, a temperature based on a relation data representative of an affine relation between square pulse frequency measurements and temperatures, the affine relation defined by a used proportionality coefficient modified with respect to a measured proportionality coefficient of a measured affine relation linking the first measurement point and the second measurement point.

11. The temperature sensor of claim 10, further comprising a plurality of ring oscillators, each ring oscillator having inverters arranged in series configured to be supplied with the excitation signal and to generate a square pulse signal with a square pulse frequency depending on the excitation signal, the ring oscillators differing from one another by channel width-to-length ratios of transistors forming the inverters of each ring oscillator, a first square pulse frequency measurement at the first temperature being acquired for each ring oscillator, and a second square pulse frequency measurement at the second temperature being acquired for each ring oscillator, each ring oscillator having a first measurement point and a second measurement point, the temperature sensor further configured to:

determine, for each ring oscillator, a measured proportionality coefficient of the each ring oscillator of a measured affine relation coupling the first measurement point of the each ring oscillator and the second measurement point of the each ring oscillator, and select a measured proportionality coefficient based on a proximity of the measured proportionality coefficient with a previously-defined target proportionality coefficient, before determining the relation data.

12. The temperature sensor of claim 10, wherein a representative square pulse frequency increases with temperature, the measured proportionality coefficient being positive, and the used proportionality coefficient being smaller than the measured proportionality coefficient.

13. The temperature sensor of claim 10, wherein the measured proportionality coefficient and the used proportionality coefficient have the same sign.

14. The temperature sensor of claim 10, wherein the temperature sensor is further configured to determine the used proportionality coefficient by subtracting a quantity which is a function of the measured proportionality coefficient to the measured proportionality coefficient.

15. The temperature sensor of claim 10, wherein the second temperature is higher than the first temperature by at least 50° C.

16. The temperature sensor of claim 10, wherein the relation data comprises the used proportionality coefficient, or the relation data comprises a table of square pulse frequency comprising temperature pairs constructed from the used proportionality coefficient.

17. A temperature sensor, comprising:

a current source configured to transmit an excitation signal proportional to a temperature-dependent current;

a plurality of ring oscillators, each ring oscillator having inverters arranged in series and configured to be supplied with the excitation signal and generate a square pulse signal with a square pulse frequency depending on the excitation signal; and a memory configured to store relation data representative of an affine relation between square pulse frequency measurements and temperatures, the temperature sensor configured to:

determine, at a first temperature, a first measurement point based on the first temperature and a first measurement from a first square pulse signal, determine, at a second temperature, a second measurement point based on the second temperature and a second measurement from a second square pulse signal, the second temperature being higher than the first temperature, and determine a temperature based on a relation data from the first measurement point and the second measurement point, the relation data representative of an affine relation defined by a used proportionality coefficient modified with respect to a measured proportionality coefficient of a measured affine relation linking the first measurement point and the second measurement point.

18. The temperature sensor of claim 17, wherein the second temperature is higher than the first temperature by at least 50° C.

19. The temperature sensor of claim 17, wherein each square pulse frequency increases with temperature, and each measured proportionality coefficient is positive.

20. The temperature sensor of claim 17, wherein the first temperature is in a temperature range between 10° C. and 40° C., and the second temperature is in a temperature range from 100° C. and 150° C.

* * * * *